United States Patent
Pandey et al.

(10) Patent No.: US 11,835,991 B2
(45) Date of Patent: Dec. 5, 2023

(54) SELF-TEST CONTROLLER, AND ASSOCIATED METHOD

(71) Applicant: STMicroelectronics International N.V., Geneva (CH)

(72) Inventors: Amulya Pandey, Kanpur (IN); Balwinder Singh Soni, Faridabad (IN); Amritanshu Anand, Noida (IN); Venkata Narayanan Srinivasan, Greater Noida (IN)

(73) Assignee: STMicroelectronics International N.V., Geneva (CH)

( * ) Notice: Subject to any disclaimer, the term of this patent is extended or adjusted under 35 U.S.C. 154(b) by 143 days.

(21) Appl. No.: 17/208,935

(22) Filed: Mar. 22, 2021

(65) Prior Publication Data
US 2022/0300389 A1   Sep. 22, 2022

(51) Int. Cl.
G06F 11/27 (2006.01)
G01R 31/3177 (2006.01)
G06F 1/08 (2006.01)

(52) U.S. Cl.
CPC .......... *G06F 11/27* (2013.01); *G01R 31/3177* (2013.01); *G06F 1/08* (2013.01)

(58) Field of Classification Search
CPC ........ G06F 11/27; G06F 11/26; G06F 1/3296; G06F 1/08; G06F 1/324
See application file for complete search history.

(56) References Cited

U.S. PATENT DOCUMENTS

| | | | |
|---|---|---|---|
| 6,255,836 B1 | 7/2001 | Schwarz et al. | |
| 6,286,118 B1 | 9/2001 | Churchill et al. | |
| 6,343,366 B1 * | 1/2002 | Okitaka | G11C 29/44 |
| | | | 714/719 |
| 7,134,061 B2 | 11/2006 | Agashe et al. | |
| 7,356,741 B2 | 4/2008 | Boehler | |
| 7,360,134 B1 | 4/2008 | Jacobson et al. | |
| 7,716,546 B2 | 5/2010 | Le et al. | |
| 7,761,763 B2 | 7/2010 | Shin et al. | |
| 7,831,877 B2 | 11/2010 | Sul et al. | |
| 7,945,823 B2 | 5/2011 | Doddamane et al. | |
| 7,996,743 B1 | 8/2011 | Tan et al. | |
| 8,694,276 B2 | 4/2014 | Sontakke et al. | |
| 8,935,586 B2 | 1/2015 | Chickanosky et al. | |
| 9,196,381 B2 | 11/2015 | Wang et al. | |
| 9,823,296 B2 * | 11/2017 | Thanner | G01R 31/31701 |
| 10,191,110 B2 | 1/2019 | Abhishek et al. | |
| 10,802,077 B1 * | 10/2020 | Srinivasan | G11C 29/32 |
| 10,823,781 B1 * | 11/2020 | Schat | G11C 29/12015 |
| 11,133,806 B1 * | 9/2021 | Jacquet | G06F 1/10 |
| 11,218,153 B1 * | 1/2022 | Moehlmann | H03L 7/0992 |
| 2001/0047498 A1 | 11/2001 | Whetsel | |
| 2002/0194558 A1 | 12/2002 | Wang et al. | |
| 2003/0074616 A1 | 4/2003 | Dorsey | |
| 2003/0074621 A1 * | 4/2003 | Dorsey | G11C 29/16 |
| | | | 714/733 |

(Continued)

*Primary Examiner* — Kamini B Patel
(74) *Attorney, Agent, or Firm* — Slater Matsil, LLP

(57) ABSTRACT

In an embodiment, a method for managing self-tests in an integrated circuit (IC) includes: receiving built-in-self-test (BIST) configuration data; configuring a first clock to a first frequency based on the BIST configuration data; performing a first BIST test at the first frequency; configuring a second clock to a second frequency that is different from the first frequency; and performing a second BIST test at the second frequency.

26 Claims, 9 Drawing Sheets

(56) References Cited

U.S. PATENT DOCUMENTS

| | | | |
|---|---|---|---|
| 2004/0073840 A1* | 4/2004 | Toros | G01R 31/31705 714/E11.169 |
| 2005/0160339 A1* | 7/2005 | Forlenza | G01R 31/318342 714/733 |
| 2005/0262492 A1 | 11/2005 | Goetting et al. | |
| 2006/0190789 A1 | 8/2006 | Kebichi et al. | |
| 2008/0016421 A1 | 1/2008 | McDevitt | |
| 2008/0178053 A1* | 7/2008 | Gorman | G11C 29/4401 714/E11.169 |
| 2009/0063921 A1 | 3/2009 | Aipperspach et al. | |
| 2009/0327824 A1* | 12/2009 | Alaniz | G06F 11/27 714/E11.155 |
| 2010/0293426 A1* | 11/2010 | Dasnurkar | G01R 31/31709 714/E11.155 |
| 2011/0204933 A1* | 8/2011 | Sato | H03M 1/1042 327/145 |
| 2014/0053003 A1 | 2/2014 | Moyer et al. | |
| 2016/0025808 A1* | 1/2016 | Singh | G01R 31/3187 714/733 |
| 2016/0197685 A1* | 7/2016 | Tsai | H04B 17/29 370/242 |
| 2018/0005663 A1* | 1/2018 | Raghuraman | G11C 29/36 |
| 2018/0019781 A1* | 1/2018 | Payne | H04B 17/00 |
| 2018/0205621 A1* | 7/2018 | Ungar | G06F 11/263 |
| 2020/0075116 A1* | 3/2020 | Kalva | G06F 13/00 |
| 2020/0116783 A1* | 4/2020 | Kalva | G06Q 10/087 |
| 2020/0333399 A1* | 10/2020 | Srinivasan | G11C 29/54 |
| 2022/0108760 A1* | 4/2022 | Sinha | G11C 29/36 |
| 2022/0277799 A1* | 9/2022 | Khor | G11C 29/18 |
| 2022/0334181 A1* | 10/2022 | Poudel | G01R 31/3193 |

* cited by examiner

SELF-TEST CONTROLLER, AND ASSOCIATED METHOD

TECHNICAL FIELD

The present disclosure relates generally to an electronic system and method, and, in particular embodiments, to a self-test controller, and associated method.

BACKGROUND

The complexity of integrated circuits (ICs) has increased steadily in recent years. Some ICs include a plurality of circuits. For example, a system-on-a-chip (SoC) may integrate all components of a computer or another electronic system on a chip to, e.g., perform a number of functions, such as receiving and sending data, receiving and making phone calls, playing virtual games, etc. For example, a microcontroller IC may include, in addition to a central processing unit (CPU) and associated registers, a plurality of memories for, e.g., software storage, analog-to-digital converters (ADCs), digital-to-analog converters (DACs), communication interface modules, such as serial peripheral interface (SPI) and inter-integrated circuit ($I^2C$), internal oscillators, as well as other digital and analog circuits. Other examples of complex ICs include field programmable gate arrays (FPGAs), power management ICs (PMICs), processors (such as ARM or x86 processors), digital signal processors (DSPs), etc.

Some applications are considered safety critical and demand self-test and/or real time monitoring of its circuits during mission mode (during normal operation), or during start/stop of the application in the field. An example is an automotive grade application controlling safety mechanism such as Braking, Parking, Lane change, etc.

Complex ICs may include one or more built-in-self-test (BIST) circuits. A BIST circuit, (also referred to as built-in test circuit, or BIT circuit), is a test circuit included in the complex IC that allows such complex IC to test itself. For example, logic BIST (LBIST) is used for testing logic circuits of the complex IC by applying test patterns, e.g., generated by a pseudo-random generator, using a scan circuit of the complex IC.

BIST circuits may be used to assist automatic test equipment (ATE), e.g., by testing logical or memory functions, or improve coverage or other test performance during manufacturing (production) of the IC.

BIST circuits may also be used in the field (e.g., during start/stop). For example, an automotive grade microcontroller that is compliant with ISO 26262, such as compliant with automotive safety integrity level (ASIL) D, may use one or more BIST circuits to test different components of the microcontroller each time the car is started, and report any detected faults to a central processing unit of the car. For example, a microcontroller for automotive applications that is compliant with ISO 26262, such as compliant with automotive safety integrity level (ASIL) D, may use a memory BIST (MBIST) to test the integrated memories for faults each time the car starts, as well as when the car is on (e.g., while driving).

SUMMARY

In accordance with an embodiment, a method for managing self-tests in an integrated circuit (IC) includes: receiving built-in-self-test (BIST) configuration data; configuring a first clock to a first frequency based on the BIST configuration data; performing a first BIST test at the first frequency; configuring a second clock to a second frequency that is different from the first frequency; and performing a second BIST test at the second frequency.

In accordance with an embodiment, an integrated circuit includes: a plurality of logic circuits; a plurality of memories; and a programmable self-test controller configured to: receive built-in-self-test (BIST) configuration data, configure a first clock to a first frequency based on the BIST configuration data, cause performance of a first logic BIST (LBIST) test at the first frequency to test a first logic circuit of the plurality of logic circuits, configure a second clock to a second frequency that is different from the first frequency, and cause performance of a first memory BIST (MBIST) test at the second frequency to test a first memory of the plurality of memories.

In accordance with an embodiment, a self-test controller includes: a master finite state machine (FSM); and a built-in-self-test (BIST) FSM coupled to the master FSM, where the master FSM is configured to receive built-in-self-test (BIST) configuration data and configure first and second clocks to first and second frequencies, respectively, based on the BIST configuration data, the second frequency being different from the first frequency, where the BIST FSM is configured to trigger a first BIST controller to perform a first BIST test at the first frequency, and a second BIST controller to perform a second BIST to perform a second BIST test at the second frequency.

In accordance with an embodiment, a device includes: an electronic control unit (ECU); and a system-on-chip including: a plurality of logic circuits, a plurality of memories, and a programmable self-test controller configured to: receive built-in-self-test (BIST) configuration data, configure a first clock to a first frequency based on the BIST configuration data, cause performance of a first logic BIST (LBIST) test at the first frequency to test a first logic circuit of the plurality of logic circuits, configure a second clock to a second frequency that is different from the first frequency, cause performance of a first memory BIST (MBIST) test at the second frequency to test a first memory of the plurality of memories, and cause transmission of detected faults associated with the first LBIST and first MBIST to an error management logic of the ECU.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

Figure 1:
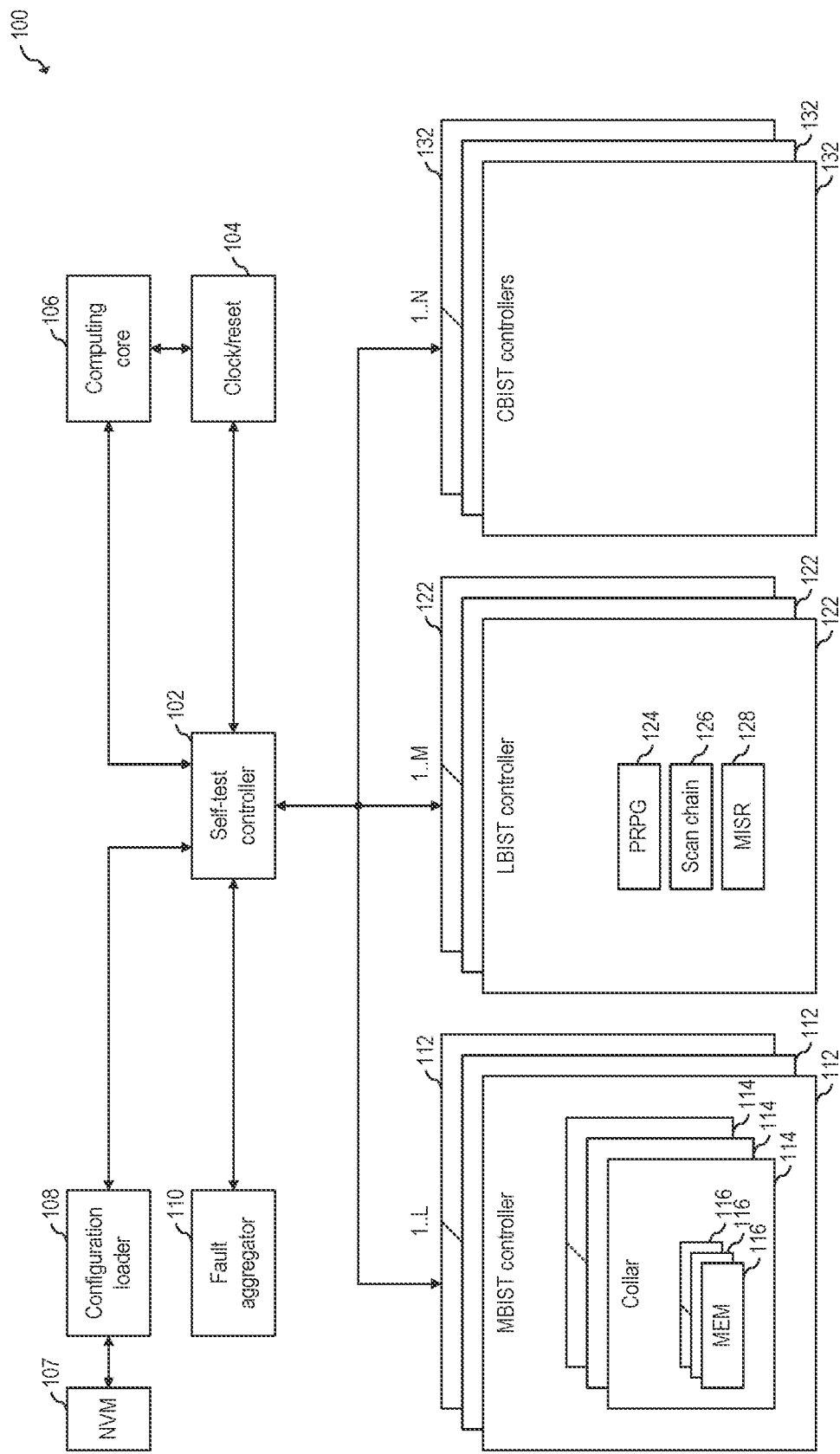
FIG. 1 shows an SoC including a plurality of BIST controllers, according to an embodiment of the present invention.

The making and using of the embodiments disclosed are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The description below illustrates the various specific details to provide an in-depth understanding of several example embodiments according to the description. The embodiments may be obtained without one or more of the specific details, or with other methods, components, materials and the like. In other cases, known structures, materials or operations are not shown or described in detail so as not to obscure the different aspects of the embodiments. References to "an embodiment" in this description indicate that a particular configuration, structure or feature described in relation to the embodiment is included in at least one embodiment. Consequently, phrases such as "in one embodiment" that may appear at different points of the present description do not necessarily refer exactly to the same embodiment. Furthermore, specific formations, structures or features may be combined in any appropriate manner in one or more embodiments.

Embodiments of the present invention will be described in a specific context, a self-test controller (also referred to as self-test controller unit, or STCU) of an SoC, and associated methods, e.g., in automotive applications. Embodiments of the present invention may be used in other applications, such as other safety critical applications, such as space applications, for example. Some embodiments may be used in non-safety critical applications. Some embodiments may be implemented in software or firmware, e.g., using a general purpose computing core configured to run programming instructions from a coupled memory.

In an embodiment of the present invention, a comprehensive programmable self-test controller is utilized to control self-test execution of a plurality of BIST controllers during boot-time and during run-time. In some embodiments, the programmable self-test controller performs BIST scheduling, BIST setup, fault management, phase-locked-loop (PLL) management, and/or self-integrity check monitoring, e.g., via cyclic redundancy check (CRC), and/or includes a debug/diagnostic interface to assist in scheduling BIST operations. In some embodiments, the plurality of BIST controllers includes one or more MBIST controllers, one or more LBIST controllers, and/or one or more custom BIST (CBIST) controllers.

Safety critical circuits of an IC may employ BIST as a mechanism to test itself, e.g., to enhance safety and increase reliability. MBIST and LBIST are examples of common BIST circuits. Other BIST circuits may also be used. For example, CBIST circuits, e.g., such as BIST circuits that may employ custom techniques for testing one or more digital and/or analog circuits, may also be used.

When testing an IC using a plurality of BIST circuits, it may be desirable to achieve a target test coverage with a short test time, and without exceeding a maximum peak transient power consumption and without exceeding a maximum average power consumption. For example, in automotive safety critical products, the BIST circuits may perform testing of the IC at start-up (e.g., each time the car is turned on) during boot time. Thus, it may be desirable to achieve the target test coverage with a short test time so that the full start-up of the car is not delayed for too long. A way to reduce test time is to run multiple BIST circuits in parallel. However, running multiple BIST circuits in parallel may increase the peak and/or average power consumption of the IC, which should be kept lower than the rated power consumption specification of the IC. Thus, in some ICs, there is a trade-off between test coverage, test time, and power consumption. For example, higher test coverage may result in higher test time. Reducing the test time while keeping the same test coverage may result in higher power consumption. Reducing power consumption may be achieved by reducing coverage and/or delaying execution of one or more BIST tests.

In an embodiment of the present invention, a single self-test controller is used to setup and schedule the triggering of a plurality of BIST tests so as to minimize test time while achieving a target test coverage with a peak power consumption lower than a maximum peak power level, and with an average power consumption lower than a maximum average power level.

FIG. 1 shows SoC 100 including a plurality of BIST controllers, according to an embodiment of the present invention. SoC 100 includes self-test controller 102, clock/reset circuit 104, computing core 106, configuration loader 108, fault aggregator 110, L MBIST controllers 112, M LBIST controllers 122, and N CBIST controllers 132.

During self-test, self-test controller 102 schedules the triggering of the L MBIST controllers 112, M LBIST controllers 122, and N CBIST controllers 132 for executing respective MBIST, LBIST and CBIST tests. Faults detected by any of the BIST controllers (112, 122, 132) are transmitted (e.g., synchronously or asynchronously) to self-test controller 102. Self-test controller 102 transmits the received faults to fault aggregator 110. Fault aggregator 110 aggregates the detected faults and transmits them to an external circuit (e.g., such as a central processing unit of a car).

In some embodiments, self-test controller 102 schedules the triggering of some of the L MBIST controllers 112, M LBIST controllers 122, and N CBIST controllers 132 in a staggered manner so as to keep peak power consumption lower than a maximum peak power consumption while scheduling the triggering of some others of the L MBIST controllers 112, M LBIST controllers 122, and N CBIST controllers 132 in parallel so as to minimize test time.

In some embodiments, self-test controller 102 determines the sequence of triggering events, as well as the sequence and configuration of other tasks (e.g., BIST setup, PLL setup) based on a state of SoC 100 or event associated with SoC 100. For example, during boot time (e.g., before the car is allowed to fully turn on), computing core 106 may be in an off state, sleep state, or another state different from an active state. Thus, during boot time, self-test controller 102 may determine the BIST trigger schedule, and any other task based on an input from configuration loader 108 and trigger execution of BIST testing. In some embodiments, configuration loader 108 provides such input to self-test controller 102 upon request (e.g., via a conventional or custom communication channel between self-test controller 102 and configuration loader 108) by loading a configuration file from non-volatile memory (NVM) 107. Thus, in some embodiments, self-test controller 102 is advantageously capable of performing the setup, scheduling and triggering of the BIST circuits (e.g., 112, 122, 132) in an autonomous manner (e.g., offline—without input from a computing core of SoC 100).

During runtime (e.g., when the car is fully turned on, such as while driving), computing core 106 may be in an active state and may provide BIST setup and/or BIST scheduling input to self-test controller 102. Thus, in some embodiments, self-test controller 102 may perform the setup, scheduling, and triggering of the BIST circuits (e.g., 112, 122, 132) based on input from one or more computing cores of SoC 100. In some embodiments, during runtime, self-test controller 102 may perform the setup, scheduling, and triggering of the BIST circuits (e.g., 112, 122, 132) based on input from configuration loader 108 (e.g., which may be coupled to a memory) and/or a memory coupled to self-test controller 102, in addition to an input from one or more computing cores of SoC 100.

In some embodiments, self-test controller 102 may determine the state of SoC 100 based on an input from a register (not shown), computing core 106, and/or clock and reset circuit 104. For example, in some embodiments, clock and reset circuit 104 may assert a signal (e.g., via a register bit, or via an IRQ node) to indicate that SoC 100 is undergoing a reset process, thus prompting a boot of SoC 100, which may prompt the execution of BIST tests during boot time. As another non-limiting example, self-test controller 102 may determine the state of computing core 106 based on a response or lack of response from computing core 106, and may determine whether to run a boot time BIST testing or a runtime BIST testing based on the determined state of computing core 106.

In some embodiments, a single self-test controller 102 is used to setup and schedule the triggering of L MBIST controllers 112, M LBIST controllers 122, and N CBIST controllers 132. By using a single self-test controller, some embodiments advantageously achieve a target test coverage, test time, and power consumption during BIST tests with a lower silicon area when compared to implementations using a plurality of controllers for managing the L MBIST controllers 112, M LBIST controllers 122, and N CBIST controllers 132.

NVM 107 is configured to store data corresponding to scheduling and/or other type of BIST configuration data. As will be described in more detail later, the data stored in NVM 107 may be arranged in files, such as pointer files. Each pointer file may include information about when to perform a particular BIST test, as well as BIST setup information.

In some embodiments, NVM 107 may be pre-configured by the SoC manufacturer. In some embodiments, an SoC user (e.g., a human, an external controller, etc.) may configure NVM 107 (e.g., via self-test controller 102). In some embodiments, NVM 107 may be internal to SoC 100. In some embodiments, NVM 107 may be external to SoC 100. NVM 107 may be implemented in any way known in the art.

In some embodiments, L may be an integer greater than or equal to 0, such as 1, 2, 3, 4, 10, or more. In some embodiments, M may be an integer greater than or equal to 0, such as 1, 2, 3, 4, 10, or more. In some embodiments, N may be an integer greater than or equal to 0, such as 1, 2, 3, 4, 10, or more. In some embodiments, L, M, and N may all be equal. In some embodiments, L, M, and N may be all different. Other implementations are also possible. For example, in some embodiments, L is greater than or equal to 2, M is greater than or equal to 2, and N is 0.

Clock and reset circuit 104 is configured to provide one or more clocks to computing core 106 and/or to self-test controller 102. Clock and reset circuit 104 is also configured to reset SoC 104 (e.g., upon an internal or external event). In some embodiments, clock and reset circuit 104 includes a PLL (not shown) that is configurable, e.g., by self-test controller 102. Clock and reset circuit 104 may be implemented in any way known in the art.

Computing core 106 is configured to perform computing tasks of SoC 100. In some embodiments, computing core 106 may be implemented as an ARM core, such as an ARM Cortex® core. Some embodiments may implemented computing core 106 in other ways, such as using an x86, or RISC architecture. Other implementations are also possible.

In some embodiments, SoC 100 may include a single computing core 106. In other embodiments, SoC 100 may include a plurality of identical computing cores 106. In some embodiments, SoC 100 may include a plurality of different computing cores.

Configuration loader 108 is configured to load data (e.g., from a file) stored in NVM 107 and transmit the loaded data (e.g., including BIST setup and/or BIST scheduling information) to self-test controller 102. In some embodiments, configuration loader 108 may be implemented with a finite state machine (FSM). Other implementations are also possible.

Fault aggregator 110 is configured to aggregate faults detected by the BIST circuits (112, 122, 132), and transmit the aggregated faults, e.g., to an external controller. In some embodiments, fault aggregator 110 receives the faults asynchronously from self-test controller 102. Other implementations are also possible. For example, in some embodiments, fault aggregator 110 may receive the detected faults asynchronously directly from the BIST controllers (112, 122, 132). In some embodiments, fault aggregator 110 may receive the detected faults synchronously (e.g., from self-test controller 102 or directly from the BIST controllers).

In some embodiments, fault aggregator 110 may be implemented with an FSM. Other implementations are also possible.

In some embodiments, self-test controller 102 is advantageously independent of processor architecture. For example, in some embodiments, self-test controller 102 may be implemented with a custom or generic controller or processor configured to execute programming instructions stored in a memory coupled to the controller or processor. For example, in some embodiments, self-test controller 102 may be implemented based on an ARM, x86, or RISC architecture. In some embodiments, self-test controller 102 may be implemented with an FSM. Other implementations are also possible.

MBIST controller 112 is configured to setup and trigger execution of MBIST tests to test memories 116 using collar 114 (a wrapper around memories 116). MBIST controller 112 also collects faults detected in memories 116 and transmits the detected faults to fault aggregator 110 (e.g., via self-test controller 102). The MBIST tests may be implemented in any way known in the art.

MBIST controller 112 may be implemented, e.g., with an FSM. Other implementations are also possible.

Memories 116 may be implemented in any way known in the art. Collar 114 may be implemented in any way known in the art.

Some embodiments may implement L MBIST controllers 112, were each of the L MBIST controllers has the same architecture. In some embodiments, one or more of the L MBIST controllers may have a different architecture than another of the L MBIST controllers.

LBIST controller 122 is configured to setup and trigger execution of LBIST tests to test logic circuits of SoC 100. LBIST controller 122 also collects faults detected in logic partitions and transmits the detected faults to fault aggregator 110 (e.g., via self-test controller 102). The LBIST tests may be implemented in any way known in the art. For example, in some embodiments, pseudo-random pattern generator (PRPG) 124 is used to generate test patters. The test patterns are fed to scan chain 126 to test the logic circuits of SoC 100. Multiple-input signature register (MISR) 128 is used to detect the response of the logic circuits under test to determine faults.

LBIST controller 122 may be implemented, e.g., with an FSM. Other implementations are also possible.

Pseudo-random pattern generator 126, scan chain(s) 126, and MISR circuit 128 may be implemented in any way known in the art.

Some embodiments may implement M LBIST controllers 122, were each of the M LBIST controllers has the same architecture. In some embodiments, one or more of the M LBIST controllers may have a different architecture than another of the M LBIST controllers. For example, in some embodiments, a given LBIST controller may have a serial programming interface and another LBIST controller may have a parallel programming interface.

CBIST controller 132 is configured to setup and trigger execution of CBIST tests to test analog and/or digital circuits of SoC 100 using custom techniques. Examples of custom techniques for BIST testing analog and/or digital circuits include techniques for BIST testing comparators, analog-to-digital converters (ADC), digital-to-analog converters (DAC), etc., to obtain parametric performance data.

CBIST controller 132 may be implemented, e.g., with an FSM. Other implementations are also possible.

Some embodiments may implement N CBIST controllers 132, were each of the N CBIST controllers has the same architecture. In some embodiments, one or more of the N CBIST controllers may have a different architecture than another of the N CBIST controllers.

Figure 2:
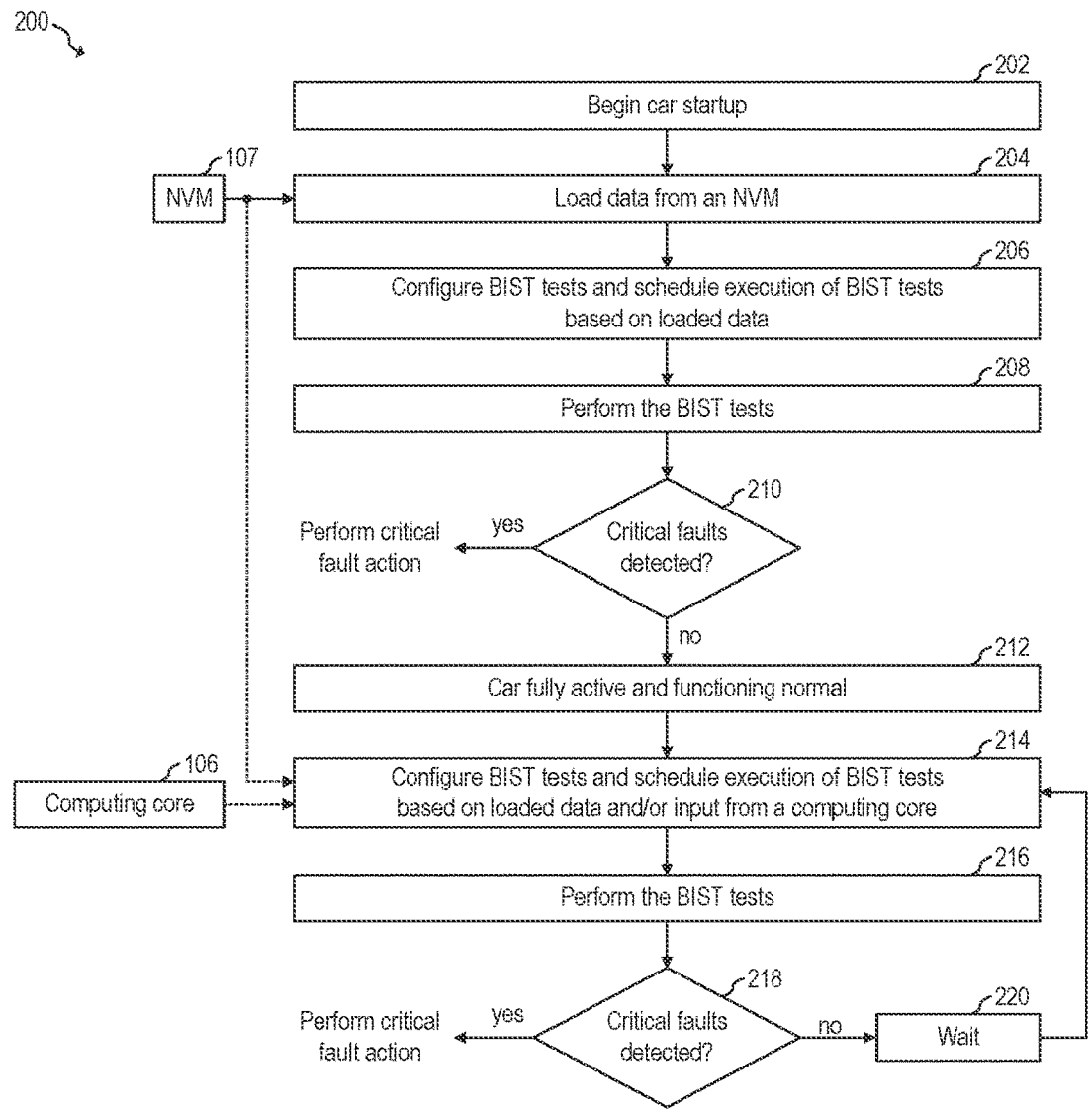
FIG. 2 shows a flow chart of an embodiment method 200 for performing setup and scheduling of a plurality of BIST tests in a car, according to an embodiment of the present invention.

FIG. 2 shows a flow chart of embodiment method 200 for performing setup and scheduling of a plurality of BIST tests in a car, according to an embodiment of the present invention. Method 200 may be performed, e.g., in SoC 100.

During step 202, a car may begin a startup process. For example, in some embodiments, introducing a key into the car may trigger the beginning of the car startup process.

During step 204, data from a non-volatile memory (such as NVM 107) is loaded. In some embodiments, loading the data comprises loading pointers to data location, and accessing the data comprises reading data from NVM 107 based on the loaded pointers. In some embodiments, loading the data comprises reading the data and storing the loaded data in a temporary memory location, such as a cache, registers, or other, e.g., volatile memory.

During step 206, BIST tests, such as BIST tests associated with BIST controllers 112, 122, and/or 132), are setup and scheduled for execution based on the data loaded during step 204.

During step 208, the BIST tests are executed based on the schedule determined during step 206.

In some embodiments, steps 206 and 208 may be performed in parallel. For example, a first BIST test may be setup and triggered during step 206, and while the first BIST test is being executed during step 208, a second BIST test may be setup during step 208, etc.

If critical faults are detected during step 210, a critical fault action may be performed. If no critical faults are detected during step 210, the car operates normally during step 212.

During step 214, BIST tests, such as BIST tests associated with BIST controllers 112, 122, and/or 132), are setup and scheduled for execution based on the data from a memory (such as NVM 107) and/or from input from a computing core (e.g., 106).

During step 216, the BIST tests setup and scheduled during step 214 are executed. In some embodiments, steps 214 and 216 may be performed in parallel.

If critical faults are detected during step 218, a critical fault action may be performed. If no critical faults are detected during step 218, the car waits during steps 220, and then proceeds to execute step 214.

In some embodiments, critical faults are faults that are capable of producing a safety hazard. In some embodiments, possible critical fault actions (e.g., from step 210 and/or 218) are: preventing the car from fully turning on, turning on a light in the dashboard to indicate the presence of a critical fault, turning off one or more features of the car, and changing the mode of operation (e.g., to a safety mode) of one or more features of the car.

In some embodiments, setting up BIST tests (e.g., during steps 206 and 214) includes configuring the frequency of clock signals associated with BIST controllers, configuring whether a particular portion of a BIST testing is to be bypassed or not, and/or setting initial parameters of the BIST.

Figure 3:
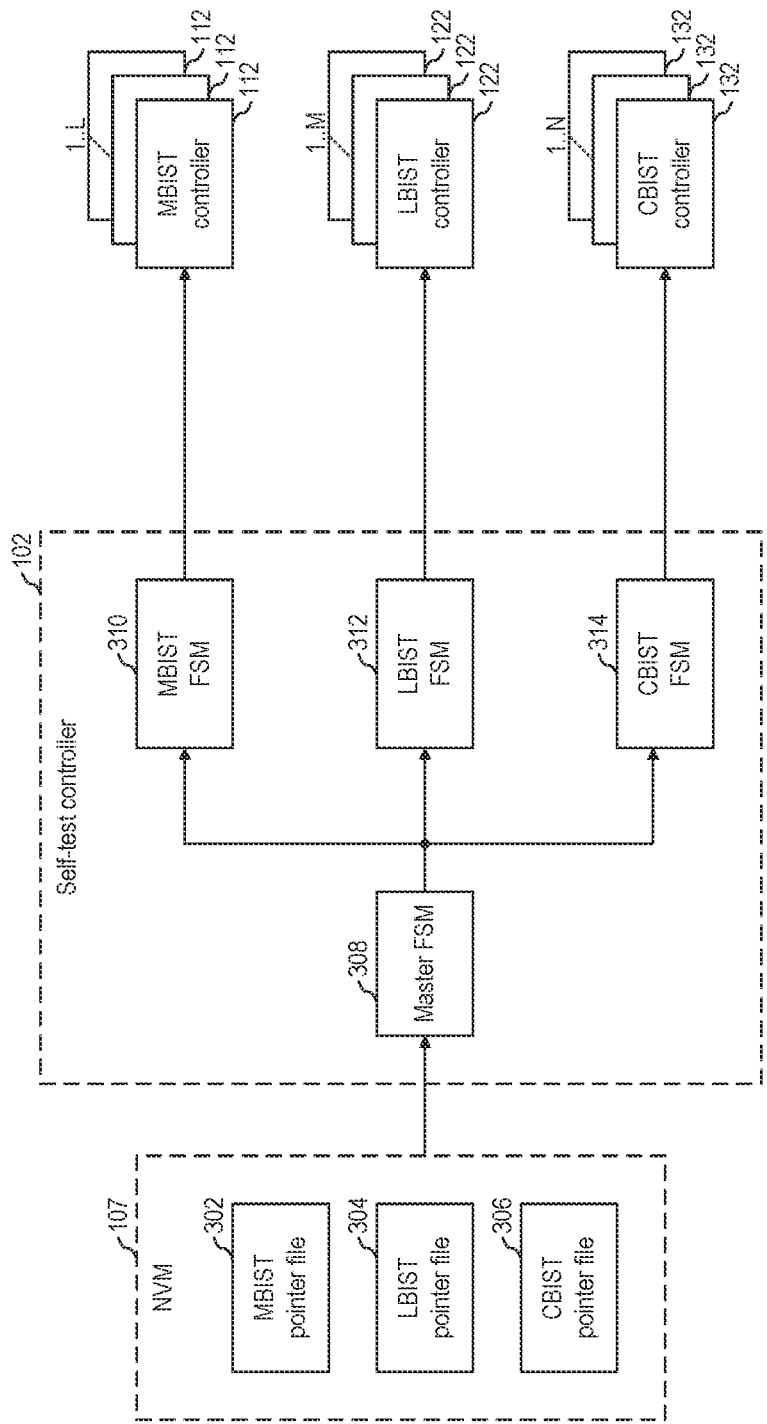
FIG. 3 shows a possible implementation of a portion of the self-test controller of FIG. 1, and a possible arrangement of data stored in the NVM of FIG. 1, according to an embodiment of the present invention.

FIG. 3 shows a possible implementation of a portion of self-test controller 102, and a possible arrangement of data stored in NVM 107, according to an embodiment of the present invention. As shown in FIG. 3, self-test controller 102 includes master FSM 308, MBIST FSM 310, LBIST FSM 312, and CBIST FSM 314.

During BIST testing (e.g., during step 204), master FSM 308 may receive from NVM 107 pointer files 302, 304, and 306 associated with MBIST, LBIST, and CBIST respectively. In some embodiments, pointer files 302, 304, and 306 include BIST scheduling information as well as BIST setup information for their respective BIST circuits.

Master FSM 308 triggers (e.g., during step 206) operation of MBIST FSM 310, LBIST FSM 312, and CBIST FSM 314 based on pointer files 302, 304, and 306, respectively. In response to respective triggers, MBIST FSM 310, LBIST FSM 312, and CBIST FSM 314, respectively trigger MBIST controller(s) 112, LBIST controller(s) 122, and CBIST controller(s) 132 to perform respective MBIST, LBIST, and CBIST tests according to respective pointer files 302, 304, and 306.

In some embodiments, master FSM 308 reads the pointer files (e.g., 302, 304, and 306) and configures the BIST FSMs (e.g., 310, 312, and 314) based on the respective pointer files.

In some embodiments, the BIST FSMs (e.g., 310, 312, and 314) configure their respective BIST controllers (e.g., 112, 122, 132), e.g., with static information, before triggering the BIST controllers to perform the BIST testing.

In some embodiments, FSMs 308, 310, 312, and 314 may be implemented in hardware with combinatorial logic. In some embodiments, FSMs 308, 310, 312, and 314 may be implemented in software or firmware, e.g., in a generic or custom controller or processor coupled to a memory.

Figure 4:
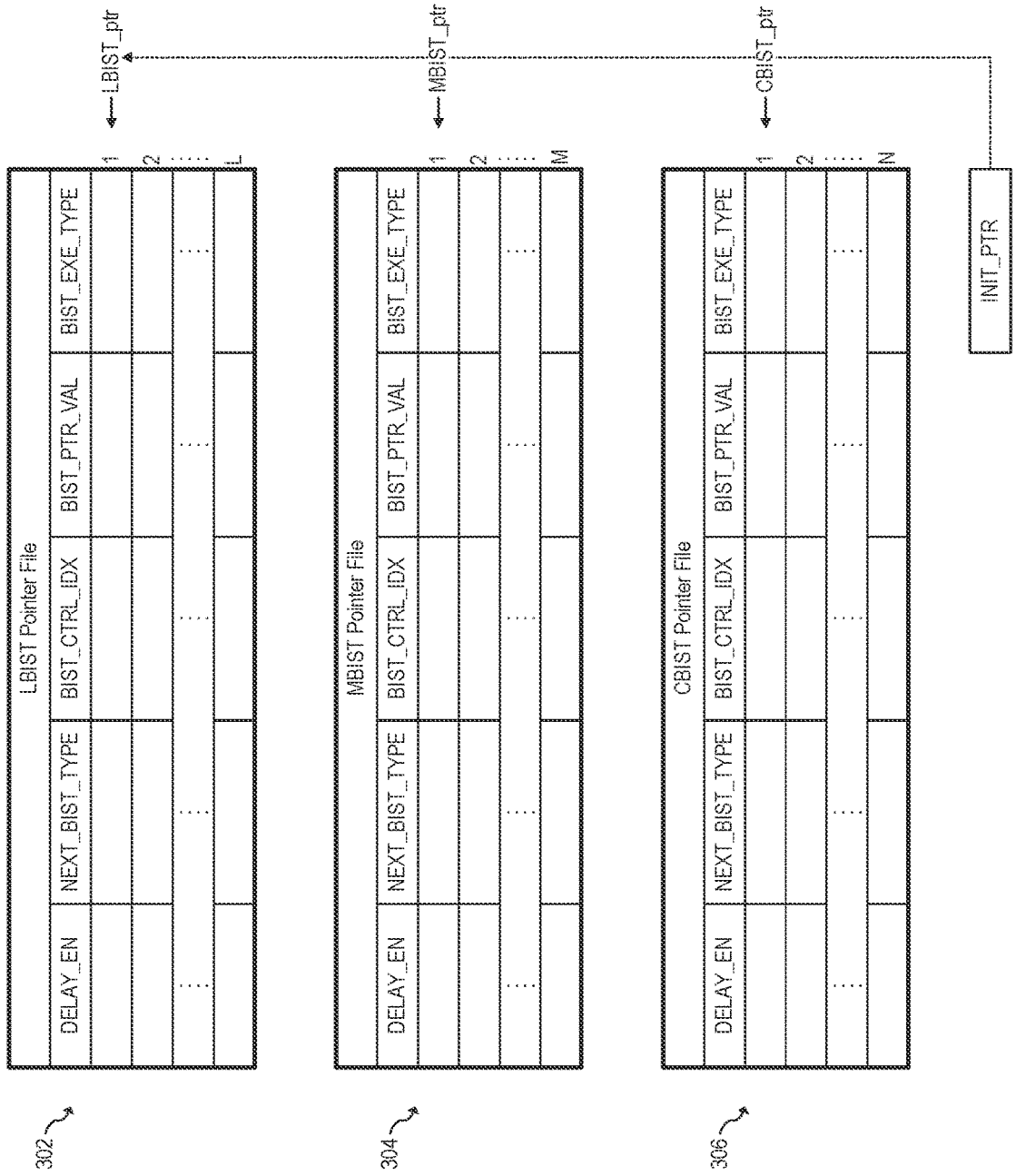
FIG. 4 shows a possible implementation of the pointer files of FIG. 3, according to an embodiment of the present invention.

FIG. 4 shows a possible implementation of pointer files 302, 304, and 306, according to an embodiment of the present invention. As shown in FIG. 4, in some embodiments, NVM 107 may include three pointer files (e.g., 302, 304, and 306) for LBIST, MBIST, and CBIST respectively. Each pointer file (e.g., 302, 304, and 306) includes a plurality of fields (e.g., DELAY_EN, NEXT_BIST_TYPE, BIST_CTLR_IDX, BIST_PTR_VAL, and BIST_EXE_TYPE), and a plurality of rows. Each row, when executed, causes the triggering of an associated BIST controller so that a corresponding BIST test is performed.

The DELAY_EN field is used to specify a delay between triggering a BIST controller (e.g., 112, 122, 132) and the execution of the associated BIST. For example, no delay or a delay of zero causes the execution of a BIST test, e.g., simultaneously, with reception of the trigger by the respective BIST controller. A delay greater than zero causes the BIST controller to wait for the specified delay amount before executing the associated BIST test. In some embodiments, the delay is managed by respective BIST FSM (e.g., 310, 312, 314). In some embodiments, the delay is managed by master FSM 308. By managing the delay using self-test controller 102 instead of the BIST controllers (e.g., 112, 122, 132), some embodiments are capable of staggering execution of BIST tests without modifying or adding complexity to the BIST controller(s).

Figures 5A, 5B:
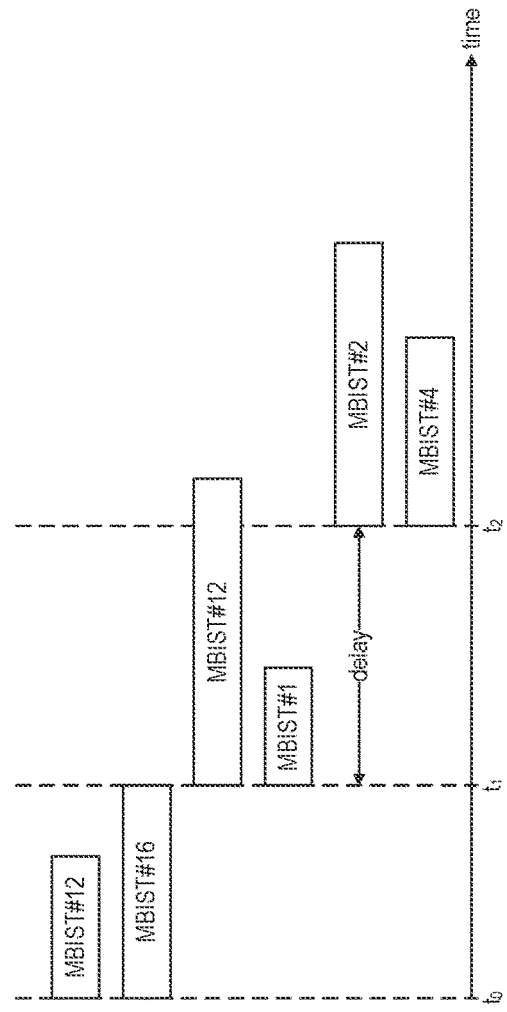
FIGS. 5A and 5B illustrated an example of a populated MBIST pointer file, and corresponding BIST testing execution timeline, respectively, according to an embodiment of the present invention.
Figure 6:
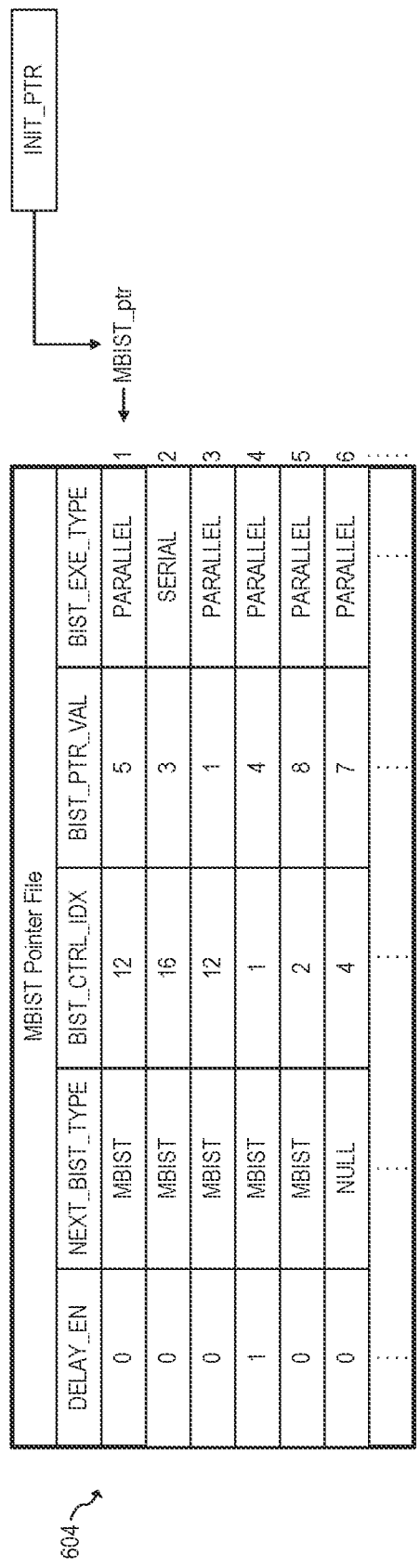
FIG. 6 shows an MBIST pointer file, according to an embodiment of the present invention.

In some embodiments, the delay specified in DELAY_EN field is applied before execution of the respective row (e.g., as illustrated in FIG. 5A). In some embodiments, the delay specified in DELAY_EN field is applied after execution of the respective row (e.g., as illustrated in FIG. 6).

The NEXT_BIST_TYPE field indicates which pointer file should select the next BIST controller to be triggered. For example, if row 1 of the LBIST pointer file includes MBIST in the NEXT_BIST_TYPE, then the next row of the MBIST pointer file to be executed (e.g., row 1) is executed next.

The BIST_CTRL_IDX field indicates which BIST controller is to be triggered. For example, if row 1 of the LBIST pointer file includes a 7 in the BIST_CTRL_IDX field, then the LBIST controller 122 associated with an identification number of 7 is triggered when row 1 of the LBIST pointer file is executed.

The BIST_PTR_VAL field is used for cascade operation (to indicate the memory index, e.g., in implementations in which a given controller is associated with a plurality of memories). For example, if row 1 of the MBIST pointer file includes a 1 in the BIST_PTR_VAL, then the memories of collar 114 associated with the identification number of 1 is selected for performing the MBIST test. In some embodiments, a value of 0 or null is indicative that parallel operation (for testing a plurality of memories in parallel) is not applicable.

The BIST_EXE_TYPE field is used to specify whether execution of the BIST is to be performed sequentially (serially) or concurrently (in parallel) with the next BIST. For example, if:

row 1 of the LBIST pointer file includes, 0, LBIST, 7, null, concurrently, for fields DELAY_EN, NEXT_BIST_TYPE, BIST_CTRL_IDX, BIST_PTR_VAL, BIST_EXE_TYPE, respectively;

row 2 of the LBIST pointer file includes, 0, LBIST, 8, null, sequentially, for fields DELAY_EN, NEXT_BIST_TYPE, BIST_CTRL_IDX, BIST_PTR_VAL, BIST_EXE_TYPE, respectively; and row 3 of the LBIST pointer file includes, 0, LBIST, 10, null, sequentially, for fields DELAY_EN, NEXT_BIST_TYPE, BIST_CTRL_IDX, BIST_PTR_VAL, BIST_EXE_TYPE, respectively, then, when row 1 of the LBIST pointer file is executed, LBIST controllers 122 associated with identification 7 and 8 are triggered concurrently (e.g., simultaneously). Once the BIST testing associated with LBIST controller 122 associated with identification number 8 finishes, then LBIST controller 122 associated with identification number 10 is triggered.

In some embodiments, performing BIST testing in parallel advantageously allow for reducing test time.

In some embodiments, performing BIST testing serially advantageously allow for reducing peak power consumption. In some embodiments, performing BIST testing serially advantageously allows for finalizing the testing of a given circuit before testing a further circuit that depends on the given circuit. For example, in some embodiments, an LBIST test is performed on the logic associated with a given memory and/or associated MBIST controller, and such LBIST test is finalized before executing an MBIST test to test the given memory.

A pointer file pointer (e.g., LBIST_ptr, MBIST_ptr, and CBIST_ptr) is used to keep track of the next row of the pointer file to be executed. For example, if MBIST_ptr is pointing to row 3 of MBIST pointer file 304, and if row 1 of LBIST pointer file 302 is currently being executed and has MBIST in the NEXT_BIST_TYPE field, then row 3 of the MBIST pointer file 304 is executed next.

In some embodiments, an initial pointer INIT_PTR points to the first pointer file (or to the BIST pointer file pointer of the first BIST pointer file) to be executed. For example, if INIT_PTR points to the MBIST pointer file 304, then the first BIST to be executed is the BIST corresponding to the location in which MBIST_ptr is pointing to. In some embodiments, the initial pointer INIT_PTR is stored in bits of a register, which is loaded during step 204 from NVM 107. In some embodiments, the location to which the INIT_PTR points to is a location in NVM 107 corresponding to the first pointer file (e.g., which may be programmed to be, e.g., pointer files 302, 304, or 306).

In some embodiments, NVM 107 may include a plurality of MBIST pointer files, LBIST pointer files, and/or CBIST pointer files, which may be used at different points in time based, e.g., on the state of SoC 100. For example, an MBIST pointer file specifying a particular sequence may be used during boot-time, and a second MBIST pointer file may be used when the SoC 100 is in the active state.

It is understood that some embodiments may include a single pointer file, two pointer files, or more than three pointer files. For example, in an embodiment in which SoC 100 implements MBIST but not LBIST or CBIST, NVM 107 may include an MBIST pointer file and not include an LBIST pointer file or CBIST pointer file. As another non-limiting example, in an embodiment in which SoC 100 implements LBIST and MBIST but not CBIST, NVM 107 may include an LBIST pointer file and an MBIST pointer file and not include a CBIST pointer file. As another non-limiting example, in an embodiment in which SoC 100 implements LBIST, MBIST, and two types of CBIST, NVM 107 may include an LBIST pointer file, an MBIST pointer file, and two CBIST pointer files.

As shown in FIG. 4, LBIST pointer file 302 may include L rows, MBIST pointer file 304 may include M rows, and CBIST pointer file 306 may include N rows. However, a different number of rows may be used, and may be programmatically changed, e.g., by a user. For example, in some embodiments, the BIST pointer file may include less rows than the number of associated controllers. For example, in some embodiments, some of the BIST controllers may not be triggered.

In some embodiments, the pointer file may include more rows than the number of associated BIST controllers. For example, a particular BIST controller may be triggered in different rows, so that the associated BIST tests are performed at different times.

FIGS. 5A and 5B illustrated an example of a populated MBIST pointer file, and corresponding BIST testing execution timeline, respectively, according to an embodiment of the present invention.

As shown in FIG. 5A, the initial pointer INIT_PTR points to the MBIST pointer file pointer MBIST_ptr, which in turn points to row 1 of MBIST pointer file 504. In some embodiments, the loading of initial pointer INIT_PTR so that it points to the MBIST pointer file pointer MBIST_ptr may be performed during step 204. In some embodiments, MBIST pointer file 504 is processed by MBIST FSM 310 and MBIST FSM 310 triggers execution of the associated MBIST controllers 112.

When row 1 of the MBIST pointer file 504 is executed, the MBIST controller associated with identification number 12 is triggered (based on the BIST_CTRL_IDX field). Since the BIST_EXE_TYPE field of row 1 is set to "PARALLEL" and the NEXT_BIST_TYPE is set to MBIST, pointer MBIST_ptr is incremented so that it points to the next row of MBIST pointer file 504), and such row (in this example, row 2) is executed immediately. Since row 2 has the BIST_CTRL_IDX field with a value of 16, the MBIST controller associated with identification number 16 is triggered. As shown in FIG. 5B, MBIST controllers associated with identification numbers 12 and 16 are triggered and begin execution of their respective MBIST tests at time to.

Since row 2 has the BIST_EXE_TYPE field set to "SERIAL," execution of row 2 finishes before the next BIST is executed. Since the NEXT_BIST_TYPE is set to MBIST, pointer MBIST_ptr is incremented so that it points to the next row of MBIST pointer file 504), and such row (in this example, row 3) is executed once row 2 finishes execution.

When row 3 of the MBIST pointer file 504 is executed, the MBIST controller associated with identification number 12 is triggered (based on the BIST_CTRL_IDX field). Since the BIST_EXE_TYPE field of row 3 is set to "PARALLEL" and the NEXT_BIST_TYPE is set to MBIST, pointer MBIST_ptr is incremented so that it points to the next row of MBIST pointer file 504), and such row (in this example, row 4) is executed immediately. Since row 4 has the BIST_CTRL_IDX field with a value of 1, the MBIST controller associated with identification number 1 is triggered. As shown in FIG. 5B, MBIST controllers associated with identification numbers 12 and 1 are triggered and begin execution of their respective MBIST tests at time $t_1$.

Since the BIST_EXE_TYPE field of row 4 is set to "PARALLEL" and the NEXT_BIST_TYPE is set to MBIST, pointer MBIST_ptr is incremented so that it points to the next row of MBIST pointer file 504), and such row (in this example, row 5) is executed immediately. However, since row 5 has DELAY_EN field set to 1, a corresponding delay (as shown by the delay between times $t_1$ and $t_2$ in FIG. 5B) is applied before the MBIST controller associated with identification number 2 is triggered. In some embodiments, the duration of the delay is configurable, and may cause, e.g., the MBIST controller associated with identification number 2 to start before, at the same time, or after the MBIST controller associated with identification number 1 finishes.

After the delay time, the MBIST controller associated with identification number 2 is triggered (based on data from row 5). Since the BIST_EXE_TYPE field of row 5 is set to "PARALLEL" and the NEXT_BIST_TYPE is set to MBIST, pointer MBIST_ptr is incremented so that it points to the next row of MBIST pointer file 504), and such row (in this example, row 6) is executed together with row 5. As shown in FIG. 5B, MBIST controllers 2 and 4 are triggered and begin execution of their respective BIST tests at time $t_2$.

Since row 6 has the NEXT_BIST_TYPE field with a null value, the BIST testing is considered finished.

In some embodiments, the BIST pointer files (e.g., 302, 304, 306) may be implemented with different number and/or type of fields. For example, FIG. 6 shows MBIST pointer file 604, according to an embodiment of the present invention. MBIST pointer file 604 operates in a similar manner as MBIST pointer file 504, and produces a similar result (e.g., as shown in FIG. 5B). MBIST pointer file 604, however, applies the DELAY_EN field after execution of the respective row instead of before execution of the respective row. Thus, row 4 of MBIST pointer file 604 having a value of 1 achieves the same result as row 5 of MBIST pointer file 504 having a value of 1.

Advantages of some embodiments include the ability to configure the BIST schedule to optimize one or more parameters (e.g., reduce test time, reduce peak or average power consumption, increase or change test coverage, etc.) without modifying the circuit design. In some embodiments, such optimizations may advantageously be performed by a consumer using the IC in a bigger system (e.g., a car) so that the coverage is targeted specifically for the set of features used by such consumer). In some embodiments, such optimizations may advantageously be performed in the field, e.g., via a firmware update of the product (e.g., a car), e.g., to fix bus or improve/optimize performance after the product has been delivered (e.g., sold) to the consumer).

In an embodiment of the present invention, a self-test controller includes a plurality of BIST interfaces operating based on clocks having frequencies independent from functional clocks. In some embodiments, BIST interfaces operating based on clocks having frequencies independent from functional clocks advantageously allows for optimizing BIST test time and power consumption by allowing the adjustment of the frequency of operation of one or more BIST controllers to adjust (increase/decrease) the BIST test speed without impacting clock signals provided to functional circuits of the SoC.

Figure 7:
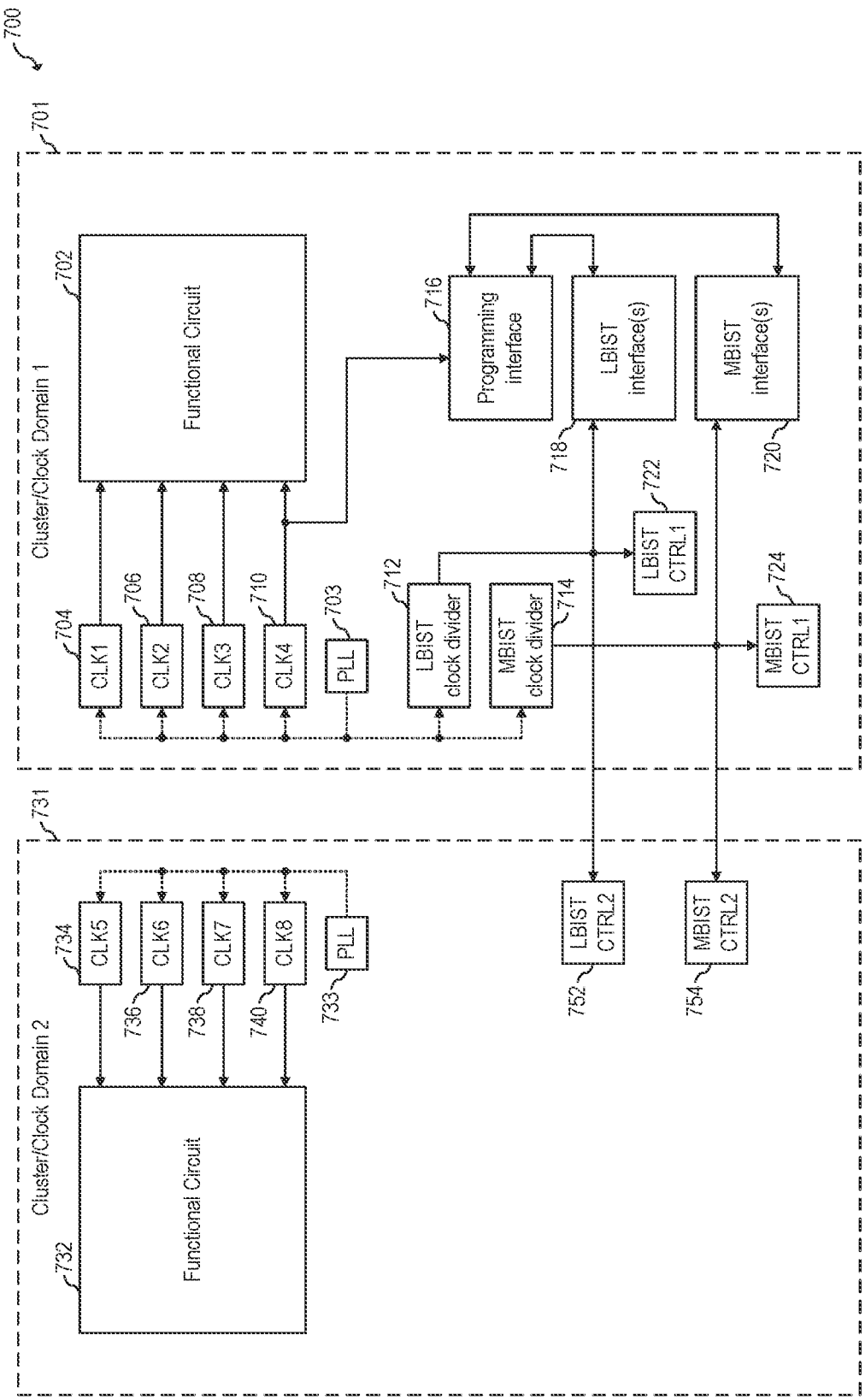
FIG. 7 shows a clock distribution architecture of an SoC, according to an embodiment of the present invention.

FIG. 7 shows a clock distribution architecture SoC 700, according to an embodiment of the present invention. SoC 100 may be implemented as SoC 700.

During a programing step (e.g., 202, or the configuration of a BIST interface during steps 206 or 214), programming interface 716 may access a memory (e.g., 107) to load configuration instructions and/or may receive configuration instructions from functional circuit 702, or another internal or external circuit. Programming interface 716 then configures one or more BIST interfaces (e.g., 718, 720) based on the received configuration instructions.

The BIST interfaces (e.g., 718, 720) configure their associated BIST controllers (e.g., during steps 206, 214). The BIST controllers (e.g., 722, 724, 752, 754), once triggered, perform their respective BIST testing (e.g., during steps 208, 216). As shown in FIG. 7, the BIST interfaces may be LBIST interfaces or MBIST interfaces. In some embodiments, other types of BIST interfaces, such as CBIST interfaces, may also be used.

As shown in FIG. 7, SoC 700 may include multiple clock domains (e.g., 701, 731). For example, in the embodiment of FIG. 7, functional circuits 702 and 732 are in different clock domains (701, and 731, respectively) and operate based on a respective plurality of clocks. Programming interface operates based on a clock (e.g., 710) that is also used by functional circuit 702.

Clock divider 712 provides one or more clock signals to LBIST interface 718. Clock divider 712 also provides clock signals to a plurality of LBIST controllers 122, such as LBIST controllers 722 and 752. Clock divider 714 provides one or more clock signals to MBIST interface 720. Clock divider 714 also provides clock signals to a plurality of MBIST controllers 112, such as MBIST controllers 724 and 754.

Clock dividers 712 and 714 are capable of generating one or more divided clocks, e.g., at different frequencies. Thus, some embodiments are advantageously capable of adjusting the frequency of operation of one or more BIST controllers to adjust (increase/decrease) the speed of respective BIST testing to optimize test time, and power consumption. For example, in some embodiments, the frequency of a BIST controller (e.g., 724) may be increased, and a frequency of another BIST controller (e.g., 754) may be decreased, e.g., so that both BIST tests are performed in parallel (e.g., thus decreasing test time) while keeping peak power consumption below a maximum peak power level.

As shown, programming interface 716, and one or more BIST interfaces (e.g., 718, 720) may operate based on different clocks. In some embodiments, clock synchronizers may be used to allow communication between circuits 716, 718, and 720. Clock synchronizers may be implemented in any way known in the art.

Some embodiments may include a plurality of BIST interfaces 718 and 720. For example, in some embodiments, a first LBIST interface 718 may control a first set of one or more LBIST controllers 122, and a second LBIST interface 720 may control a second set of one or more LBIST controllers 122. In some embodiments, the first set of controllers 122 may include a parallel programming interface and the second set of controllers 122 may include a serial programming interface.

Some embodiments may include a BIST interface (e.g., 718, 720) for each BIST controller (e.g., 722, 752, 724, 754). In some embodiments, a BIST interface (e.g., 718/720) may control more than one BIST controllers (e.g., 122/112).

In some embodiments, a plurality of BIST interfaces (e.g., 718 and/or 720) may share the same clock signal. In some embodiments, each BIST interface may operate based on a dedicated clock. For example, in some embodiments, clock divider 712 may produce 100 clock signals, which are supplied to 100 LBIST interfaces 718 and 100 respective LBIST controllers 122.

In some embodiments, each clock signal produced by a clock divider (e.g., 712, 714) is programmable with an independent value. For example, in some embodiments, 6 bits per clock divider (e.g., 712, 714) are used to select the division factor of the respective clock signal (e.g., for 64 possible clock frequencies). For example, in some embodiments, the clock dividers may perform a frequency division of a source clock (e.g., at 400 MHz) between 1 and 1/64. A different number of bits may be used for selecting the clock frequency produced by the clock divider.

In some embodiments, BIST controllers 722 and 724 are configured to perform BIST testing on circuits of clock domain 701. In some embodiments, BIST controllers 752 and 754 are configured to perform BIST testing on circuits of clock domain 731 (e.g., clock monitors).

In some embodiments, programming interface 716 may be implemented as master FSM 308.

In some embodiments, the configuration instructions received by programming interface 716 may include information associated with one or more BIST pointer files (e.g., 302, 304, 306).

In some embodiments, LBIST interface(s) may be implemented by respective LBIST FSMs (e.g., 312). In some embodiments, MBIST interface(s) may be implemented by respective MBIST FSMs (e.g., 310).

In some embodiments, functional cores may be two independent computing cores (e.g., 106). In some embodiments, functional circuits 702 and 732 may have the same architecture (e.g., functional circuit 732 may be a replica of functional circuit 732).

Clock domain 701 includes one or more clocks (e.g., 704, 706, 708, 710) which are synchronized and may be derived from the same PLL (e.g., 703), e.g., simultaneously. In some embodiments, clocks 704, 706, 708, and 710 have frequencies of 400 MHz, 200 MHz, 100 MHz, and 50 MHz, respectively. Other frequencies may also be used.

Clock domain 731 includes one or more clocks (e.g., 734, 736, 738, 740) which are synchronized and may be derived from the same PLL (e.g., 733), e.g., simultaneously. In some embodiments, clocks 704, 706, 708, and 710 have frequencies of 400 MHz, 200 MHz, 100 MHz, and 50 MHz, respectively. Other frequencies may also be used.

In some embodiments, clock/reset circuit 104 includes clocks 704, 706, 708, 710, 734, 736, 738, 740, PLLs 703 and 733, clock dividers 712 and 714. In some embodiments, self-test controller 102 includes clock dividers 712 and 714.

In some embodiments, PLL 703 and 733 are different PLLs. Thus, although clocks on the clock domains 701 and 731 may operate at a similar frequency (e.g., clocks 704 and 734 may both operate at 400 MHz), such clocks may not be synchronized. In some embodiments, clocks in multiple clock domains may be derived from the same PLL. For example, in some embodiments, clocks 734, 736, 738, 740, may be derived from PLL 703. Other implementations are also possible.

As shown in FIG. 7, SoC 700 may include a plurality of clock domains (e.g., 701, 731). Although FIG. 7 shows 2 clock domains only (701, 731), some embodiments include more than 2 clock domains, such as 4, 10, 32, 100, or more. In some embodiments, SoC 700 includes a single clock domain.

By using a single self-test controller for controlling BIST testing in different clock domains, some embodiments advantageously achieve lower silicon area dedicated for BIST testing when compared to using a dedicated self-test controller for each clock domain.

In some embodiments, a single self-test controller is advantageously capable of controlling BIST controllers synchronously and asynchronously.

By using a self-test controller that has a frequency independent from the functional clocks (clock signals provided to functional circuits, such as 702 and 732), some embodiments are advantageously capable of adjusting BIST frequency without impacting functional performance, and without increasing complexity of the SoC design associated with clock considerations.

In some embodiments, a self-test controller is advantageously capable of controlling the frequency of one or more PLLs of the SoC. For example, in some embodiments, self-test controller 102 is capable of enabling/disabling PLLs using configuration bits (per PLL) as well as enabling/disabling PLL lock monitoring, e.g., during runtime. By controlling the enabling/disabling of PLLs and/or their respective frequencies, some embodiments re advantageously capable of adjusting power consumption and test time to achieve an optimum performance.

Figure 8:
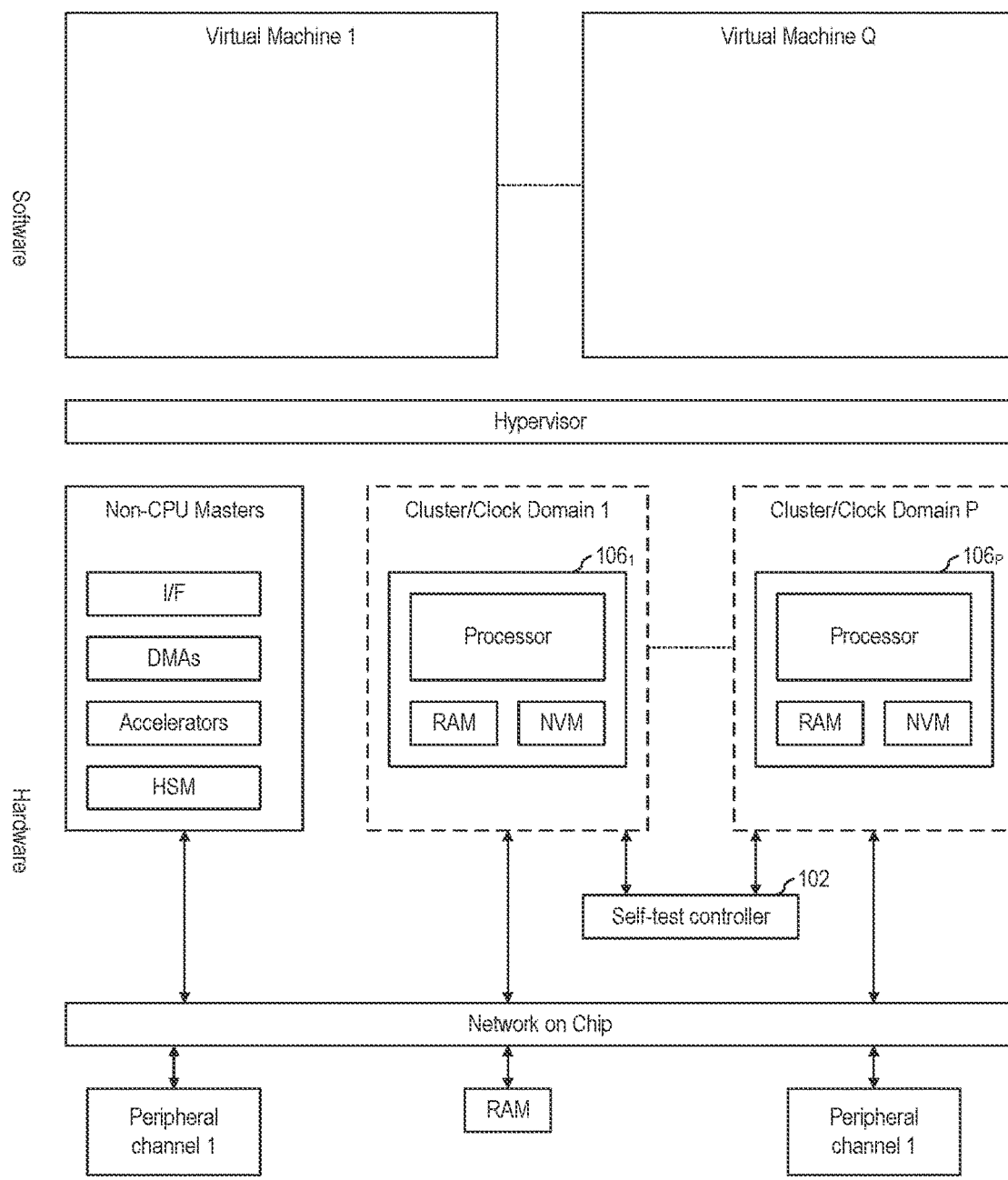
FIG. 8 shows a portion of an SoC 800, according to an embodiment of the present invention.

FIG. 8 shows a portion of SoC 800, according to an embodiment of the present invention. SoC 100 may be implemented as SoC 800.

As shown in FIG. 8, SoC 800 includes P computing cores, a plurality of volatile and non-volatile memories, and additional circuits, such as communication interfaces (I/F), direct memory access (DMA) circuits, peripheral channels, etc. In some embodiments, P may be a positive integer greater than or equal to 1.

As shown, Q virtual machines may be implemented using the hardware of SoC 800. In some embodiments, Q may be a positive integer greater than or equal to 1.

In some embodiments, self-test controller 102 is configured to test memories and logic circuits of SoC 800 during boot-time, and runtime. In some embodiments, the BIST testing performed by self-test controller 102 on SoC 800 complies with ISO 26262 ASIL-D requirements, such as the ASIL-D requirements as listed in version ISO 26262:2018 of the ISO 26262 standard.

Figure 9:
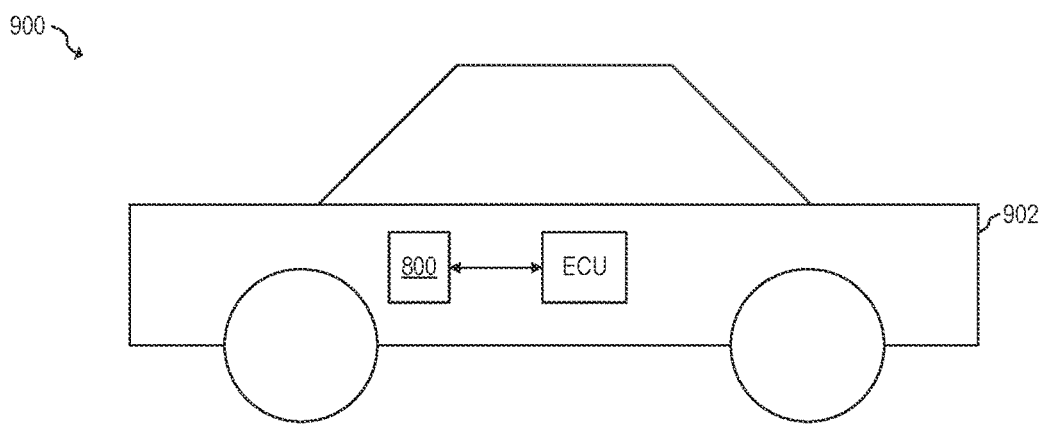
FIG. 9 shows a car implementing an SoC, according to an embodiment of the present invention.

SoC 800 may be implemented in safety critical applications, such as a car. For example, FIG. 9 shows car 902 implementing SoC 800, according to an embodiment of the present invention. Car 902 may include an electronic control unit (ECU) having an error management logic. In some embodiments, the error management logic of the ECU receives faults detected by one or more BISTs (e.g., LBIST, MBIST, CBIST) of SoC 800.

Figure 10:
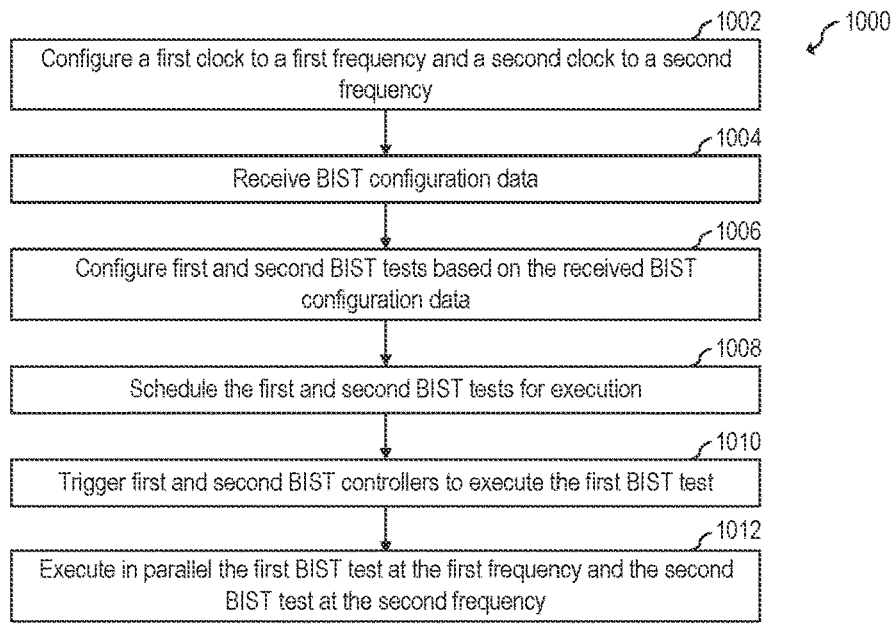
FIGS. 10 and 11 show flow charts of embodiment methods for dynamically programming BIST testing, according to embodiments of the present invention.

As described herein, in some embodiments, a self-test controller of an SoC (e.g., SoC 100, 700, 800) may be dynamically programmed to adjust which BIST test to perform, when to perform the BIST test, whether to perform the BIST test sequentially or in parallel with another BIST test, and at what speed to perform the BIST test. For example, FIG. 10 shows a flow chart of embodiment method 1000 for dynamically programming BIST testing, according to embodiments of the present invention. Method 1000 may be implemented, e.g., by self-test controller 102, e.g., of SoCs 100, 700, or 800.

During step 1002, a self-test controller (e.g., 102) configure first and second clocks (e.g., clocks from clock divider 712 and/or 714) to first and second frequencies, respectively. For example, in some embodiments, the self-test controller configures the first and second clocks to the first and second frequencies by adjusting first and second dividing factor of respective clock dividers (e.g., 712, 714), e.g., by using one or more registers. In some embodiments, the self-test controller configures the first and second clocks to the first and second frequencies by adjusting a frequency of a PLL (e.g., 703).

In some embodiments, the first and second frequencies are different frequencies. For example, in some embodiments, the first frequency is at 400 MHz and the second frequency is at 50 MHz.

In some embodiments, the first and second frequencies are higher than 50 MHz. Lower frequencies, such as 6.25 MHz (400 MHz divided by 64) or lower may also be used for the first and/or second frequencies.

In some embodiments, the first and second frequencies are the same frequency. For example, in some embodiments, the first and second frequencies are at 200 MHz. In some embodiments, the first and second clocks may not be synchronized even though the first and second clocks may have the same frequency. For example, in some embodiments, the first and second clocks have a phase difference. In some embodiments, the first and second clocks are synchronized.

During step 1004, BIST configuration data is received, e.g. by the self-test controller. For example, in some embodiments, BIST configuration data includes one or more BIST pointer files (e.g., 302, 304, 306, 504, 604).

In some embodiments, step 1002 may be performed after step 1004. For example, in some embodiments, the configuration data includes data associated with the first and second frequencies, and the first and second clocks are configured based on the configuration data.

During step 1006, first and second BIST tests are configured based on the received BIST configuration data. For example, in some embodiments, a BIST FSM (e.g., 310, 312, 314) configures one or more associated BIST controller (e.g., 112, 122, 132) based on the received BIST configuration data.

During step 1008, the first and second BIST tests are scheduled for execution. During step 1010, the first and second BIST controllers are triggered to execute the first and second BIST tests, respectively. For example in some embodiments, a master FSM (e.g., 308) schedules a BIST FSM(s) for execution, and the BIST FSM(s) triggers the associated BIST controllers based on the schedule.

During step 1012, the first and second BIST tests are executed in parallel at the first and second frequencies, respectively. In some embodiments, the first and second BIST tests may be of the same BIST type, such as MBIST (e.g., as shown in FIG. 5B). In some embodiments, the first and second BIST tests may be of different type (e.g., one may be MBIST and the other LBIST; one may be MBIST and the other CBIST; or one may be LBIST and the other CBIST).

In some embodiments (as illustrated in FIG. 10), the first and second BISTs are executed in parallel (e.g., as MBIST#2 and MBIST#4 in FIG. 5B). In some embodiments, the first and second BISTs are executed in sequentially.

In some embodiments, method 1000 is implemented as part of steps 206, 208, 214 and/or 216. For example, in some embodiments, step 1004 is performed as part of step 204, steps 1002, 1006, 1008, and 1010 are performed as part of step 206, and step 1012 is performed as part of step 208. In some embodiments, steps 1002, 1004, 1006, 1008, and 1010 are performed as part of step 214, and step 1012 is performed as part of step 216.

Figure 11:
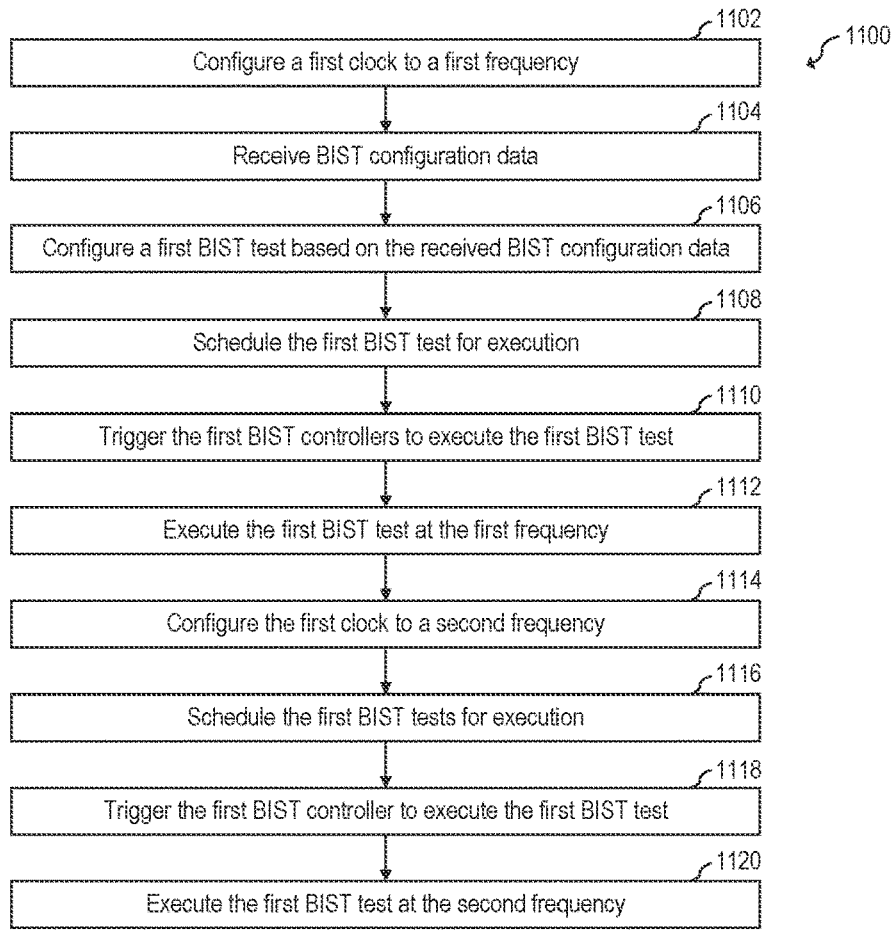

FIG. 11 shows a flow chart of embodiment method 1100 for dynamically programming BIST testing, according to embodiments of the present invention. Method 1100 may be implemented, e.g., by self-test controller 102, e.g., of SoCs 100, 700, or 800.

During step 1102, a self-test controller (e.g., 102) configures a first clock (e.g., a clock from clock divider 712 and/or 714) to a first frequency. For example, in some embodiments, the self-test controller configures the first clock to the first frequency by adjusting a dividing factor of a clock divider (e.g., 712, 714), e.g., by using a register. In some embodiments, the self-test controller configures the first clock to the first frequency by adjusting a frequency of a PLL (e.g., 703).

During step 1104, BIST configuration data is received, e.g. by the self-test controller. For example, in some embodiments, BIST configuration data includes one or more BIST pointer files (e.g., 302, 304, 306, 504, 604).

In some embodiments, step 1102 may be performed after step 1104. For example, in some embodiments, the configuration data includes data associated with the first frequency, and the first clock is configured based on the configuration data.

During step 1106, a first BIST test is configured based on the received BIST configuration data. For example, in some embodiments, a BIST FSM (e.g., 310, 312, 314) configures one or more associated BIST controller (e.g., 112, 122, 132) based on the received BIST configuration data.

During step 1108, the first BIST test is scheduled for execution. During step 1110, the first BIST controller is triggered to execute the first BIST test. For example in some embodiments, a master FSM (e.g., 308) schedules a BIST FSM for execution, and the BIST FSM triggers the associated BIST controller based on the schedule.

During step 1112, the first BIST test is executed at the first frequency.

During step 1114, the first clock is configured to a second frequency. In some embodiments, the first clock may be configured in a similar manner as during step 1102.

During step 1116, the first BIST test is scheduled for execution. In some embodiments, the first BIST test is scheduled for execution in a similar manner as during step 1108.

During step 1118, the first BIST controller is triggered to execute the first BIST test. In some embodiments, the first BIST controller is triggered in a similar manner as during step 1110.

During step 1120, the first BIST test is executed at the second frequency.

In some embodiments, the first frequency is higher than the second frequency. For example, in some embodiments, step 1112 is performed during boot-time and step 1120 is performed during runtime. Thus, in some embodiments, the first frequency is faster (e.g., to cause a faster boost-time) and the second frequency is slower (e.g., to consume less peak power). In some embodiments, the first frequency may be slower than the second frequency (e.g., based on execution time requirements).

In some embodiments, method 1100 is implemented as part of steps 206, 208, 214 and/or 216. For example, in some embodiments, step 1104 is performed as part of step 204, steps 1102, 1106, 1108, and 1110 are performed as part of step 206, step 1112 is performed as part of step 208, steps 1114, 1116, and 1118 are performed as part of step 214, and step 1120 is performed as part of step 216. In some embodiments, steps 1102, 1104, 1106, 1108, and 1110 are performed as part of step 214 during a first BIST testing cycle, and step 1112 is performed as part of step 216 during the first BIST testing cycle, steps 1114, 1116, and 1118 are performed as part of step 214 during a second BIST testing cycle, and step 1120 is performed as part of step 216 during the second BIST testing cycle.

Example embodiments of the present invention are summarized here. Other embodiments can also be understood from the entirety of the specification and the claims filed herein.

Example 1. A method for managing self-tests in an integrated circuit (IC), the method including: receiving built-in-self-test (BIST) configuration data; configuring a first clock to a first frequency based on the BIST configuration data; performing a first BIST test at the first frequency; configuring a second clock to a second frequency that is different from the first frequency; and performing a second BIST test at the second frequency.

Example 2. The method of example 1, where configuring the first clock to the first frequency includes changing a frequency of a phase-locked loop (PLL).

Example 3. The method of one of examples 1 or 2, further including: configuring a first BIST interface based on the received BIST configuration data; and triggering, by the first BIST interface, a first BIST controller based on the received BIST configuration data, where the first BIST controller performs the first BIST test.

Example 4. The method of one of examples 1 to 3, where the first BIST interface is implemented with a finite state machine (FSM).

Example 5. The method of one of examples 1 to 4, where the first clock includes a first clock divider and the second clock includes a second clock divider different from the first clock divider.

Example 6. The method of one of examples 1 to 5, where the first and second BIST tests are performed in parallel.

Example 7. The method of one of examples 1 to 6, where the first clock and the second clock are the same clock.

Example 8. The method of one of examples 1 to 7, where the first BIST test is identical to the second BIST test.

Example 9. The method of one of examples 1 to 8, where the second frequency is lower than the first frequency.

Example 10. The method of one of examples 1 to 9, where receiving BIST configuration data includes reading the BIST configuration data from non-volatile memory.

Example 11. The method of one of examples 1 to 10, where the BIST configuration data includes a BIST pointer file including a plurality of fields, and where the plurality of fields includes a BIST controller index indicative of a BIST controller to be triggered.

Example 12. The method of one of examples 1 to 11, where the plurality of fields includes a delay field indicative of a delay associated with triggering a BIST test.

Example 13. The method of one of examples 1 to 12, where the plurality of fields includes a execution type field indicative of whether a BIST test is to be performed concurrently or sequentially with another BIST test.

Example 14. The method of one of examples 1 to 13, where the plurality of fields includes a next BIST type field indicative of a BIST type of a BIST test to be executed concurrently or subsequently of another BIST test.

Example 15. The method of one of examples 1 to 14, where receiving BIST configuration data includes receiving the BIST configuration data from a computing core.

Example 16. The method of one of examples 1 to 15, where the first frequency is higher than or equal to 50 MHz.

Example 17. The method of one of examples 1 to 16, where the received BIST configuration data includes data associated with the first frequency.

Example 18. The method of one of examples 1 to 17, where the first and second BIST tests are of the same BIST type.

Example 19. The method of one of examples 1 to 18, where the same BIST type is memory BIST (MBIST).

Example 20. The method of one of examples 1 to 19, where the first and second BIST tests are of different types.

Example 21. The method of one of examples 1 to 20, where the first BIST test is a logic BIST (LBIST) test performed by a first LBIST controller, the second BIST test is a memory BIST (MBIST) test performed by an MBIST controller, and where the LBIST test tests a circuit of the MBIST controller.

Example 22. An integrated circuit including: a plurality of logic circuits; a plurality of memories; and a programmable self-test controller configured to: receive built-in-self-test (BIST) configuration data, configure a first clock to a first frequency based on the BIST configuration data, cause performance of a first logic BIST (LBIST) test at the first frequency to test a first logic circuit of the plurality of logic circuits, configure a second clock to a second frequency that is different from the first frequency, and cause performance of a first memory BIST (MBIST) test at the second frequency to test a first memory of the plurality of memories.

Example 23. The integrated circuit of example 22, further including a first computing core including the first logic circuit and the first memory, and a second computing core including a second logic circuit of the plurality of logic circuits and a second memory of the plurality of memories, where the programmable self-test controller is further configured to cause performance of a second LBIST and a second MBIST to test the second logic circuit and second memory circuit, respectively.

Example 24. A self-test controller including: a master finite state machine (FSM); and a built-in-self-test (BIST) FSM coupled to the master FSM, where the master FSM is configured to receive built-in-self-test (BIST) configuration data and configure first and second clocks to first and second frequencies, respectively, based on the BIST configuration data, the second frequency being different from the first frequency, where the BIST FSM is configured to trigger a first BIST controller to perform a first BIST test at the first frequency, and a second BIST controller to perform a second BIST to perform a second BIST test at the second frequency.

Example 25. A device including: an electronic control unit (ECU); and a system-on-chip including: a plurality of logic circuits, a plurality of memories, and a programmable self-test controller configured to: receive built-in-self-test (BIST) configuration data, configure a first clock to a first frequency based on the BIST configuration data, cause performance of a first logic BIST (LBIST) test at the first frequency to test a first logic circuit of the plurality of logic circuits, configure a second clock to a second frequency that is different from the first frequency, cause performance of a first memory BIST (MBIST) test at the second frequency to test a first memory of the plurality of memories, and cause transmission of detected faults associated with the first LBIST and first MBIST to an error management logic of the ECU.

Example 26. The device of example 25, where the device is a car.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description.

It is therefore intended that the appended claims encompass any such modifications or embodiments.

What is claimed is:

1. A method for managing self-tests in an integrated circuit (IC), the method comprising:
    receiving built-in-self-test (BIST) configuration data with a master finite state machine (FSM);
    scheduling, with the master FSM, instructions for execution on one or more BIST FSMs, the one or more BIST FSMs being coupled to the master FSM; and
    executing the instructions by triggering, by the master FSM, operation of the one or more BIST FSMs, the executing comprising:
        configuring a first clock to a first frequency based on the BIST configuration data;
        performing a first BIST test at the first frequency;
        configuring a second clock to a second frequency that is different from the first frequency; and
        performing a second BIST test at the second frequency.

2. The method of claim 1, wherein configuring the first clock to the first frequency comprises changing a frequency of a phase-locked loop (PLL).

3. The method of claim 1, further comprising:
    configuring a first BIST interface based on the received BIST configuration data; and
    triggering, by the first BIST interface, a first BIST controller based on the received BIST configuration data, wherein the first BIST controller performs the first BIST test.

4. The method of claim 3, wherein the first BIST interface is implemented with a finite state machine (FSM).

5. The method of claim 1, wherein the first clock comprises a first clock divider and the second clock comprises a second clock divider different from the first clock divider.

6. The method of claim 5, wherein the first and second BIST tests are performed in parallel.

7. The method of claim 1, wherein the first clock and the second clock are same clock.

8. The method of claim 7, wherein the first BIST test is identical to the second BIST test.

9. The method of claim 7, wherein the second frequency is lower than the first frequency.

10. The method of claim 1, wherein receiving BIST configuration data comprises reading the BIST configuration data from non-volatile memory.

11. The method of claim 10, wherein the BIST configuration data comprises a BIST pointer file comprising a plurality of fields, and wherein the plurality of fields comprises a BIST controller index indicative of a BIST controller to be triggered.

12. The method of claim 11, wherein the plurality of fields comprises a delay field indicative of a delay associated with triggering the first BIST test.

13. The method of claim 11, wherein the plurality of fields comprises a execution type field indicative of whether the first BIST test is to be performed concurrently or sequentially with another BIST test.

14. The method of claim 11, wherein the plurality of fields comprises a next BIST type field indicative of a BIST type of a third BIST test to be executed concurrently or subsequently of another BIST test.

15. The method of claim 1, wherein receiving BIST configuration data comprises receiving the BIST configuration data from a computing core.

16. The method of claim 1, wherein the first frequency is higher than or equal to 50 MHz.

17. The method of claim 1, wherein the received BIST configuration data includes data associated with the first frequency.

18. The method of claim 1, wherein the first and second BIST tests are of same BIST type.

19. The method of claim 18, wherein the same BIST type is memory BIST (MBIST).

20. The method of claim 1, wherein the first and second BIST tests are of different types.

21. The method of claim 20, wherein the first BIST test is a logic BIST (LBIST) test performed by a first LBIST controller, the second BIST test is a memory BIST (MBIST) test performed by an MBIST controller, and wherein the LBIST test tests a circuit of the MBIST controller.

22. An integrated circuit comprising:
a plurality of logic circuits, wherein a first computing core comprises a first logic circuit of the plurality of logic circuits and a second computing core comprises a second logic circuit of the plurality of logic circuits;
a plurality of memories, wherein the first computing core comprises a first memory of the plurality of memories and the second computing core comprises a second memory of the plurality of memories; and
a programmable self-test controller configured to:
receive built-in-self-test (BIST) configuration data,
configure a first clock to a first frequency based on the BIST configuration data,
cause performance of a first logic BIST (LBIST) test at the first frequency to test the first logic circuit,
cause performance of a second LBIST to test the second logic circuit;
configure a second clock to a second frequency that is different from the first frequency,
cause performance of a first memory BIST (MBIST) test at the second frequency to test the first memory, and
cause performance of a second MBIST to test the second memory.

23. The integrated circuit of claim 22, wherein the first clock comprises a phase-locked loop.

24. A self-test controller comprising:
a master finite state machine (FSM); and
a built-in-self-test (BIST) FSM coupled to the master FSM, wherein the master FSM is configured to receive built-in-self-test (BIST) configuration data and configure first and second clocks to first and second frequencies, respectively, based on the BIST configuration data, the second frequency being different from the first frequency, wherein the BIST FSM is configured to trigger a first BIST controller to perform a first BIST test at the first frequency, and a second BIST controller to perform a second BIST to perform a second BIST test at the second frequency,
wherein the master FSM or BIST FSM is implemented in hardware.

25. A device comprising:
an electronic control unit (ECU); and
a system-on-chip comprising:
a plurality of logic circuits,
a plurality of memories, and
a programmable self-test controller comprising a master finite state machine (FSM) and a built-in-self-test (BIST) FSM coupled to the master FSM, wherein the master FSM is configured to:
receive BIST configuration data,
configure a first clock to a first frequency based on the BIST configuration data, and configure a second clock to a second frequency that is different from the first frequency,
wherein the BIST FSM is configured to cause performance of a first logic BIST (LBIST) test at the first frequency to test a first logic circuit of the plurality of logic circuits and cause performance of a first memory BIST (MBIST) test at the second frequency to test a first memory of the plurality of memories, and
wherein the programmable self-test controller is further configured to: cause transmission of detected faults associated with the first LBIST and first MBIST to an error management logic of the ECU.

26. The device of claim 25, wherein the device is a car.

* * * * *